(12) United States Patent
Kim

(10) Patent No.: US 7,754,780 B2
(45) Date of Patent: Jul. 13, 2010

(54) RESIST FOR FORMING PATTERN AND METHOD FOR FORMING PATTERN USING THE SAME

(75) Inventor: Jin-Wuk Kim, Gyeonggi-Do (KR)

(73) Assignee: LG Display Co., Ltd., Seoul (KR)

( * ) Notice: Subject to any disclaimer, the term of this patent is extended or adjusted under 35 U.S.C. 154(b) by 60 days.

(21) Appl. No.: 11/148,565

(22) Filed: Jun. 9, 2005

(65) Prior Publication Data
US 2005/0282402 A1 Dec. 22, 2005

(30) Foreign Application Priority Data
Jun. 18, 2004 (KR) .................... 10-2004-0045699

(51) Int. Cl.
C09D 125/04 (2006.01)
H01L 21/84 (2006.01)
(52) U.S. Cl. .................... 522/25; 522/27; 522/178; 264/496; 216/48
(58) Field of Classification Search ............... 522/178
See application file for complete search history.

(56) References Cited

U.S. PATENT DOCUMENTS

| | | | | |
|---|---|---|---|---|
| 3,644,120 | A * | 2/1972 | Kai et al. ............. | 430/285.1 |
| 3,760,030 | A * | 9/1973 | Dean .................. | 528/14 |
| 3,880,784 | A * | 4/1975 | Wagner et al. ........ | 524/31 |
| 4,650,743 | A * | 3/1987 | Galloway ............ | 430/278.1 |
| 5,049,275 | A * | 9/1991 | Gillberg-LaForce et al. ...... | 210/500.27 |
| 5,707,780 | A * | 1/1998 | Lawton et al. ........ | 430/280.1 |
| 5,932,393 | A | 8/1999 | Cunningham et al. | |
| 6,517,744 | B1 * | 2/2003 | Hara et al. .......... | 252/506 |
| 2002/0094496 | A1 * | 7/2002 | Choi et al. .......... | 430/322 |
| 2003/0091926 | A1 * | 5/2003 | Shelnut .............. | 430/258 |
| 2006/0108905 | A1 * | 5/2006 | Cho et al. ........... | 313/292 |

FOREIGN PATENT DOCUMENTS

| | | |
|---|---|---|
| CN | 1033389 A | 6/1989 |
| EP | 0 623 440 B1 | 9/1997 |
| EP | 0 829 766 B1 | 2/2003 |
| EP | 0 879 829 B1 | 3/2003 |
| JP | 2001-81137 A * | 3/2001 |

OTHER PUBLICATIONS

An 2001:217314 from File Caplus at ACS on STN dated entry of Abstract as Mar. 28, 2001, two pages, which is an abstract of JP 20010811137 a issued Mar. 27, 2001.*

(Continued)

*Primary Examiner*—Cynthia Hamilton
(74) *Attorney, Agent, or Firm*—McKenna Long & Aldridge

(57) ABSTRACT

A method for forming a pattern includes forming an etching object layer on a substrate, applying a resist on an etching object layer, the resist including a photo-initiator, and a liquid pre-polymer including a vinyl functional group and a hydrophilic functional group, shaping the resist using a mold plate having an imprint formed therein, and hardening the resist to form a resist pattern while the mold plate shaping the resist corresponding to the imprint.

11 Claims, 3 Drawing Sheets

OTHER PUBLICATIONS

An 1995:414885, from File Caplus at ACS on STN dated Mar. 15, 1995, abstract of Hacker et al Advances in CHemistry Series (1993) pp. 557-572 abstracted, 2 pages.*

Aronson et al, Polymer Bulletin vol. 52 pp. 409-419, year 2004, published on line Oct. 29, 2004.*

Nakabayashi et al , Die Angewandte Makromolekulare CHemi vol. 195, year 1992 pp. 191-204.*

Lussow, "Photoresist Materials and Applications", Thet journal of vaccumm science,, vol. 6, No. 1, Jan. 1969, pp. 18-24.m,./basdfghjkl;'\[]poiuytrewq.*

English abstract of JP 03054569A, no date of abstract, date of JP doc, Mar. 1991, abstracted by Japanese patent office, one page.

* cited by examiner

RESIST FOR FORMING PATTERN AND METHOD FOR FORMING PATTERN USING THE SAME

The present invention claims the benefit of Korean Patent Application No. 45699/2004 filed in Korea on Jun. 18, 2004, which is hereby incorporated by reference.

BACKGROUND OF THE INVENTION

1. Field of the Invention

The present invention relates to a resist for forming a pattern and a method for forming a pattern using the same, and more particularly, to a method for forming a pattern by an in-plane printing method and a resist for the in-plane printing method.

2. Discussion of the Related Art

In general, a flat panel display device, such as a liquid crystal display (LCD) device, displays images using an active device at each pixel. For example, the active device includes a thin film transistor. Such a display device has a plurality of active devices arranged in a matrix and is driven by an active matrix driving method.

FIG. 1 is a plane view illustrating a structure of a liquid crystal display device according to the related art. In FIG. 1, a LCD device includes a plurality of gate lines 4 and data lines 6 intersecting each other, thereby defining a plurality of pixels 1 arranged in a matrix. The gate lines 4 receives a scan signal applied from a gate driving circuit (not shown), and the data lines 6 receives an image signal from a data driving circuit (not shown).

In addition, the LCD device also includes a thin film transistor (TFT) as an active device in each of the pixels 1. The TFT includes a gate electrode 3 connected to a respective one of the gate lines 4, a semiconductor layer 8 formed on the gate electrode 3, and a source/drain electrode 5 formed on the semiconductor layer 8. The semiconductor layer 8 becomes activated when the scan signal is applied to the gate electrode 3 from the respective gate line 4. In addition, when the semiconductor layer 8 is activated, the image signal is applied to the source/drain electrode 5 from a respective one of the data lines 6.

A pixel electrode 10 is formed at a display region of each of the pixels 1 electrically connected to the source/drain electrode 5. The pixel electrode 10 generates an electric field with another electrode, e.g., a common electrode (not shown), to align liquid crystal molecules (not shown) in accordance with the image signal applied through the source/drain electrode 5 when the semiconductor layer 8 is activated. As a result, the alignment of the liquid crystal molecules is controlled, such that the light transmittance thereof is controlled to display images.

FIG. 2 is a cross-sectional view illustrating a structure of a thin film transistor of the liquid crystal display device illustrated in FIG. 1. As shown in FIG. 2, the TFT is formed on a substrate 20. The substrate 20 is formed of a transparent insulating material, such as glass. In particular, the gate electrode 3 is formed on the substrate 20, a gate insulating layer 22 formed on the entire surface of the substrate 20 covering the gate electrode 3 is formed, the semiconductor layer 8 formed on the gate insulating layer 22, the source/drain electrode 5 formed on the semiconductor layer 8, and a passivation layer 25 formed on the source/drain electrode 5 for protecting the device.

In general, in an active matrix type LCD device, each pixel has a size of about several tens of µm. Accordingly, the active device, such as the TFT, arranged in the pixel has to be formed to have a minute size of about several µm. Further, as the demand for a display device of a high image quality, such as an HDTV, increases, more pixels have to be arranged on a screen of the same area. Accordingly, an active device pattern arranged in each pixel including a gate line pattern and a data line pattern has to be also formed to have an even smaller size.

In accordance with the related art, a TFT, a pattern, or a line are formed by a photolithography process using an exposing device. However, the photolithography process includes a series of processes, such as a photoresist deposition, an alignment process, an exposure process, a developing process, an etching process, a stripping process, and the like. Thus, the photolithography process is timing consuming.

In addition, photo-masks and exposure equipment used in the photolithography process are expensive. Especially, as the photolithographic process repeats several times to form patterns of the liquid crystal display device, fabrication cost increases and productivity decreases.

SUMMARY OF THE INVENTION

Accordingly, the present invention is directed to a resist for forming a pattern and a method for forming a pattern using the same that substantially obviate one or more of the problems due to limitations and disadvantages of the related art.

An object of the present invention is to provide a method for forming a pattern using an in-plane printing method without photo-masks and exposure equipment.

Another object of the present invention is to provide a resist for the in-plane printing method.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, a resist for forming a pattern includes a photo-initiator, and a liquid pre-polymer including a vinyl functional group and a hydrophilic functional group.

In another aspect, a resist for forming a pattern includes a photo-initiator, a liquid hydrophilic pre-polymer forming a linear polymer by photoreaction, and a photo acid generator for activating a physical cross-linking reaction of the linear polymer.

In yet another aspect, a method for forming a pattern includes forming an etching object layer on a substrate, applying a resist on an etching object layer, the resist including a photo-initiator, and a liquid pre-polymer including a vinyl functional group and a hydrophilic functional group, shaping the resist using a mold plate having an imprint formed therein, and hardening the resist to form a resist pattern while the mold plate shaping the resist corresponding to the imprint.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. In the drawings.

DETAILED DESCRIPTION OF THE PREFERRED EMBODIMENTS

Reference will now be made in detail to the preferred embodiments of the present invention, examples of which are illustrated in the accompanying drawings.

Figure 1:
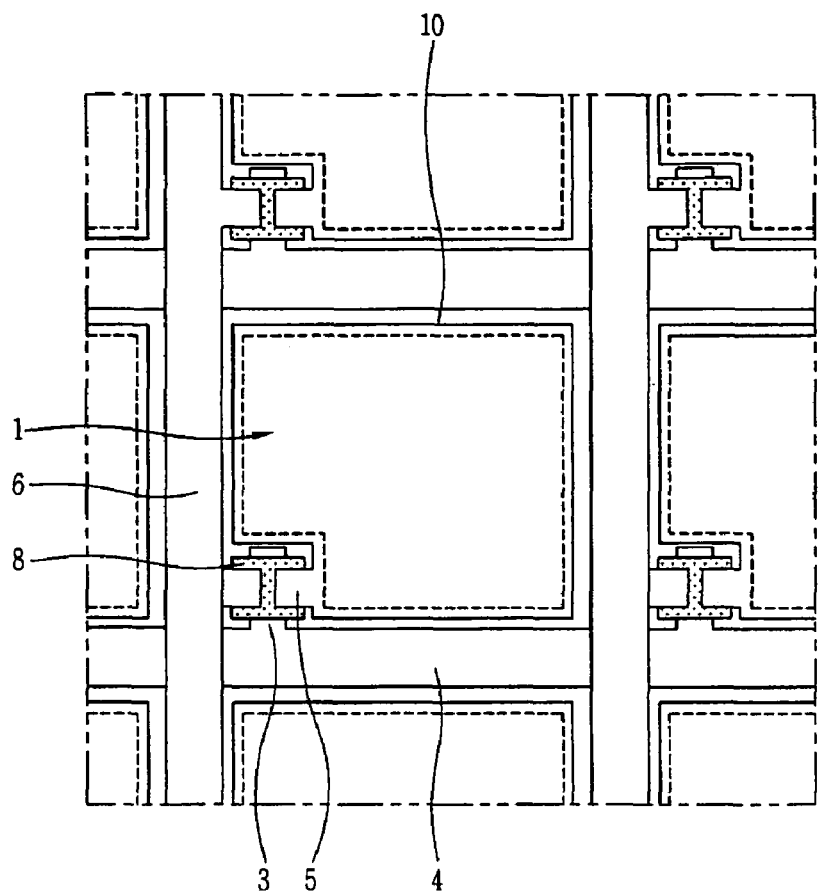
FIG. 1 is a plane view illustrating a structure of a liquid crystal display device according to the related art.
Figure 2:
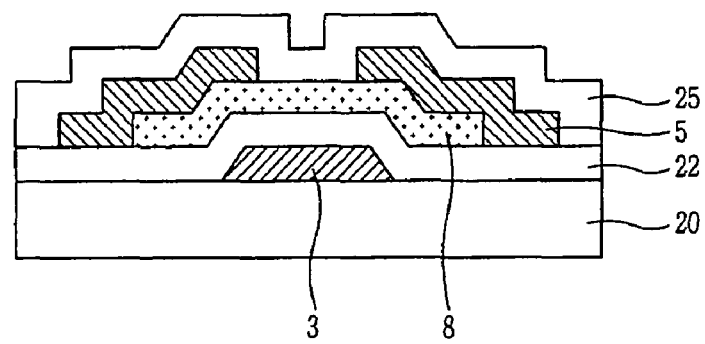
FIG. 2 is a cross-sectional view illustrating a structure of a thin film transistor of the liquid crystal display device illustrated in FIG. 1.
Figure 3A:
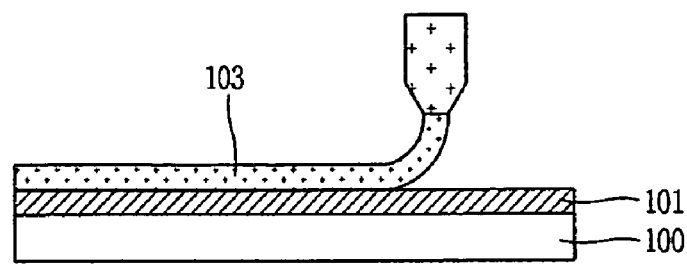
FIGS. 3A to 3F are cross-sectional views illustrating a method for forming a pattern using an in-plane printing method according to an embodiment of the present invention.

FIGS. 3A to 3F are cross-sectional views illustrating a method for forming a pattern using an in-plane printing method according to an embodiment of the present invention. As shown in FIG. 3A, a substrate 100 includes an etching object layer 101 to be selectively etched to form a desired pattern on the substrate 100. The etching object layer 101 may be a metal layer for forming, for example, an electrode of a TFT, a gate line, a data line or a pixel electrode, or a semiconductor layer for forming an active layer. In addition, the etching object layer 101 may be an insulating layer, such as SiOx or SiNx.

A resist 103 is applied over the etching object layer 101. In particular, the resist 103 may be applied over the entire surface of the etching object layer 101. The resist 103 includes a photo-initiator, and a liquid pre-polymer including a vinyl functional group and a hydrophilic functional group. For example, the liquid pre-polymer may have a structure shown in Chemical Formula 1.

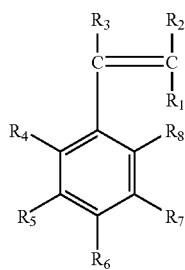

[Chemical Formula 1]

A $C_0$-$C_4$ alkyl group such as, hydrogen (H), fluorocarbon (CF) and a methyl group ($CH_3$), an ethyl group ($C_2H_5$), a propyl group ($C_3H_7$) and a butyl group ($C_4H_9$) may substitute for the $R_1$, $R_2$ and $R_3$. Hydrophilicity may substitute for one of locations of the $R_4$ to $R_8$. For example, the hydrophilicity may be one of OH, $COOHCH_3$, $COOC_2H_5$, $COOC_3H_7$, $COOC_4H_9$, $SOOHCH_3$, $SOOC_2H_5$, $SOOC_3H_7$ and $SOOC_4H_9$.

When the $R_1$, $R_2$ and $R_3$ are H, OH may substitute for $R_6$. For example, the liquid pre-polymer may become para-hydroxystyrene having a structure shown in Chemical Formula 2.

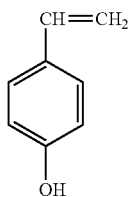

[Chemical Formula 2]

Figure 3B:
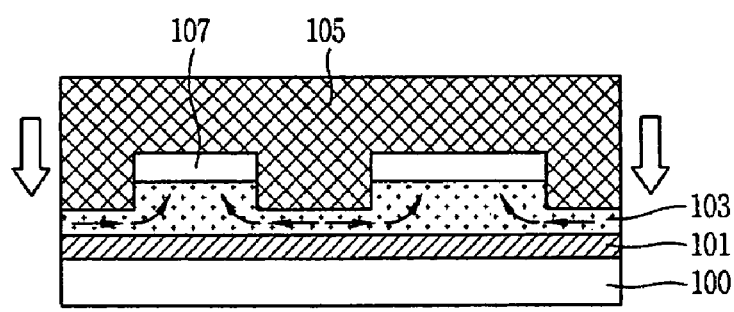

As shown in FIG. 3B, a mold plate 105 is provided above the substrate 100. The mold plate 105 includes a plurality of concave grooves 107 corresponding to a pattern desired to be formed on the substrate 100. Although only concave grooves 107 are shown to be in the mold plate 105, the mold plate 105 may have various imprints formed therein to correspond to the desired pattern.

The mold plate 105 may be fabricated with polydimethylsiloxane (PDMS), polyurethane, cross-linked novolac resin, or the like which has relatively high elasticity. In particular, a PDMS material having the hydrophobic property contrary to the resist 103 may be preferably used. Especially when the mold plate 105 has the hydrophobic property and the resist 103 has the hydrophilic property, a repulsive force is generated between the mold plate 105 and the resist 103, thereby facilitating the formation of a resist pattern as discussed in more details below.

After the mold plate 105 is aligned with the resist 103, pressure is applied, such that a contact surface of the mold plate 105 becomes in contact with the etching object layer 101. In particular, a capillary force is generated between the mold plate 105 and the substrate 100 by the pressure, and a repulsive force is generated between the mold plate 105 and the resist 103 due to the contrary properties of the mold plate 105 and the resist 103. As a result, the resist 103 moves inside the grooves 107 of the mold plate 105 as shown by the arrows in FIG. 3B, and the mold plate 105 holds the resist 103 into a desired shape.

Figure 3C:
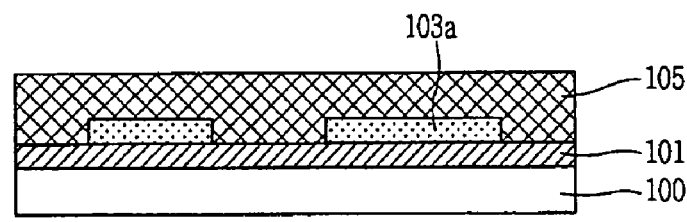

As shown in FIG. 3C, while the resist 103 is inside of the grooves 107, the resist 103 is hardened to form a resist pattern 103a. For example, UV is irradiated using an UV source (not shown) to harden the resist 103 by photoreaction. The resist pattern 103a may be a linear polymer pattern.

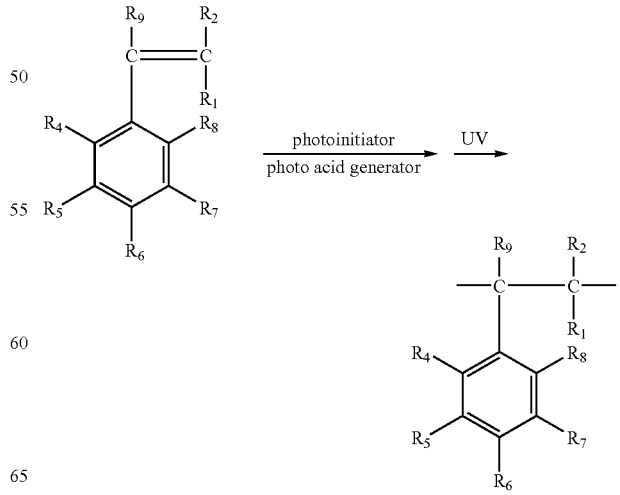

[Chemical Formula 3]

Here, when the resist 103 includes the liquid pre-polymer having para-hydroxystyrene, the liquid pre-polymer generates a linear polymer of a structure shown in [Chemical Formula 4] by light.

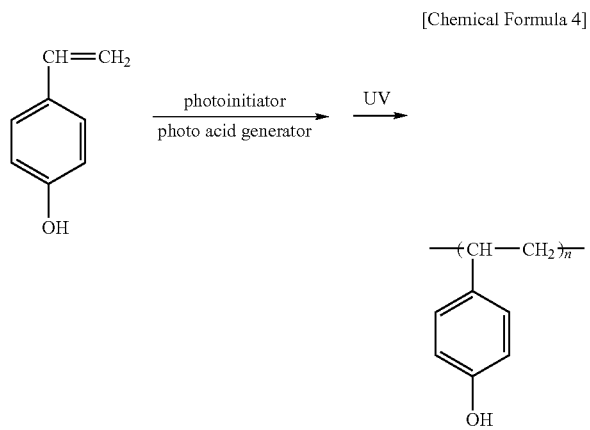

[Chemical Formula 4]

When light is irradiated and when the resist 103 includes the para-hydroxystyrene, a linear polymer is generated as the photo-initiator leads generation of radical, thereby generating polymerization centering around a vinyl group of the para-hydroxystyrene. In addition, the resist 103 also may include a photo acid generator. The photo acid generator lengthens a polymer chain, such that a physical cross-linking reaction occurs by activating the physical cross-linking reaction of the linear polymer chain, thereby increasing molecular weight. The photo acid generator includes one of triarylsulfonium salt and organic sulfonic ester. For example, the triarylsulfonium salt includes onium salt, and the organic sulfonic ester includes one of nitrobenzyl sulfonate and imidosulfonate.

The resist 103 may have the liquid hydrophillic pre-polymer, photo-initiator and photo acid generator which are mixed in the range of about 10 to 15 WT %, 80 to 90 WT % and 2 to 8 WT %, respectively. In particular, the resist 103 may preferably include 5 WT % of the photo acid generator.

Figure 3D:
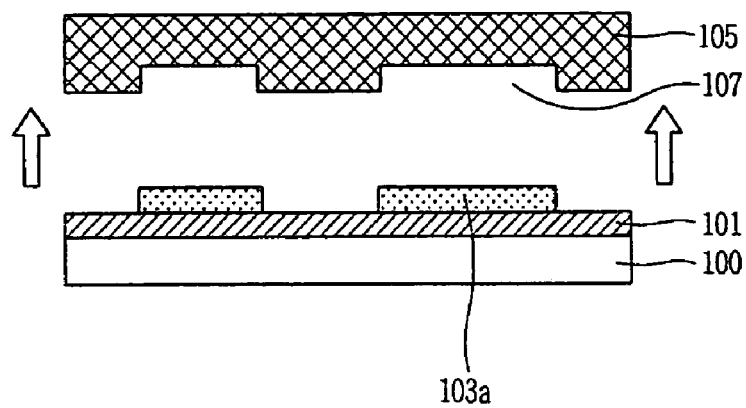

As shown in FIG. 3D, after the resist pattern 103a is formed, the mold plate 105 is separated from the substrate 100. Thus, the resist pattern 103a remains on portions of the etching object layer 101.

Figure 3E:
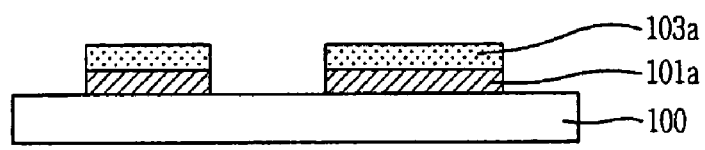

As shown in FIG. 3E, the etching object layer 101 is etched by using the resist pattern 103a as a mask. For example, the etching object layer 101 is etched using a general etching process, e.g., a dry etch or a wet etching, to form a desired pattern 101a. The pattern 101a may be an metallic structure, e.g., an electrode, a semiconductor structure, e.g., an active layer, or an insulating structure, e.g., a contact hole.

Figure 3F:
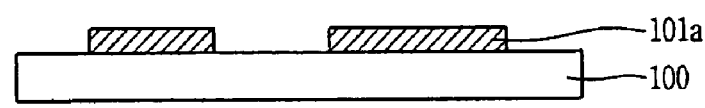

As shown in FIG. 3F, the resist pattern 103a is removed from the substrate 100 after the desired pattern 101a is formed. The resist pattern 103a may be removed by using a stripping process. For example, a stripper including organic solvents, such as organic amine, N-methylpyrrolidinone, toluene, or xylene, may be used to remove the resist pattern 103a.

Accordingly, the method for forming a pattern using an in-plane printing method according to an embodiment of the present invention includes applying a resist on an etching object layer, shaping the resist using a mold plate having at least a groove, and hardening the resist to form a resist pattern while the mold plate holding the shape of the resist. In particular, pressure is applied to contact the mold plate with the etching object layer, thereby shaping the resist. In addition, a repulsive force is generated between the mold plate and the resist to shape the resist. In particular, the resist may have a hydrophilic property and the mold plate may have a hydrophobic property, such that the repulsive force may be generated due the contrary properties of the resist and the mold plate. As a result, the resist conforms to any imprint in the mold plate, e.g., moving inside the groove of the mold plate.

The resist hardens and forms a linear polymer when light is irradiated thereon, thereby forming a resist pattern. Because the mold plate holds the shape of the resist while the resist pattern is formed, more precise and more minute patterns may be formed. Furthermore, the resist also may include a photo acid generator which restraints a reaction if a chain of a linear polymer is too long after the initiation, and simultaneously promotes the reaction if a chain of the linear polymer is too short.

The resist pattern may be a positive photoresist pattern. The photoresist also may be a negative photoresist in which a pattern is left on a region where light is irradiated or a positive photoresist in which a pattern is left on a region where light is not irradiated. A negative photoresist undergoes a chemical cross-linking reaction by light irradiation and forms a branched polymer on the region where light is irradiated. In contrast, a positive resist undergoes a physical crosslinking reaction by light irradiation and forms a linear polymer on the region where light is irradiated. Accordingly, the negative photoresist is not easily removed by the stripper, while the positive photoresist is easily removed by the stripper. Thus, the resist according to an embodiment of the present invention forms a resist pattern having a linear polymer by light irradiation. Such a resist pattern is easily removable by a stripper. For example, a stripper including an organic solvent that is generally available.

The method for forming a pattern using an in-plane printing method according to an embodiment of the present invention simplifies fabrication processes by forming a pattern by the in-plane printing method and form a precise pattern by forming a pattern by using a resist which is easily removed by the generally available stripper. Accordingly, the method for forming a pattern using an in-plane printing method according to an embodiment of the present invention does not use an expensive photo-mask, thereby reducing fabrication costs and improving production efficiency. In addition, the method for forming a pattern using an in-plane printing method according to an embodiment of the present invention may form a device on a semiconductor wafer or an active device on a glass substrate.

It will be apparent to those skilled in the art that various modifications and variations can be made in the resist for forming a pattern and the method for forming a pattern using the same of the present invention without departing from the spirit or scope of the invention. Thus, it is intended that the present invention covers the modifications and variations of this invention provided they come within the scope of the appended claims and their equivalents.

What is claimed is:

1. A resist for forming a pattern, comprising:
a photo-initiator;
a liquid pre-polymer having a structure of the following formula containing a vinyl function group and a hydrophilic functional group; and
photo acid generator:

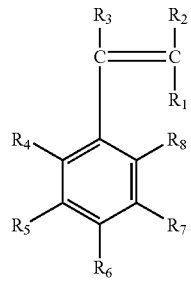

wherein each of the $R_1$, $R_2$ and $R_3$ is one selected from the group consisting of H, fluorocarbon, methyl, ethyl, propyl and butyl, and at least one of the $R_4$ to $R_8$ is a hydrophilic group selected from the group consisting of OH, $COOCH_3$, $COOC_2H_5$, $COOC_3H_7$, $COOC_4H_9$, $SOOCH_3$, $SOOC_2H_5$, $SOOC_3H_7$ and $SOOC_4H_9$, and the remaining of $R_4$ to $R_8$ is one selected from the group consisting of H, fluorocarbon, methyl, ethyl, propyl and butyl,
wherein liquid pre-polymer is about 80 to 88 WT % the resist, the photo-initiator is 10 to about 15 WT % of the resist, and the photo acid generator is about 2 to 8 WT % of the resist.

2. The resist of claim 1, wherein the photo acid generator is at least one selected from the group consisting of triarylsulfonium salt and organic sulfonic ester.

3. The resist of claim 2, wherein the organic sulfonic ester is at least one selected from the group consisting of nitrobenzyl sulfonate and imidosulfonate.

4. A method for forming a pattern, comprising:
forming an etching object layer on a substrate;
applying a resist on an etching object layer, the resist comprising a photo-initiator, and a liquid pre-polymer having a structure of the following formula containing a vinyl functional group and a hydrophilic functional group;
shaping the resist using a mold plate having an imprint formed therein; and
hardening the resist to form a resist pattern while the mold plate shaping the resist corresponding to the imprint:

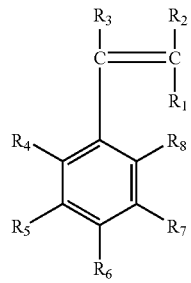

wherein each of the $R_1$, $R_2$ and $R_3$ is one selected from the group consisting of H, fluorocarbon, methyl, ethyl, propyl and butyl, and at least one of the $R_4$ to $R_8$ is a hydrophilic group selected from the group consisting of OH, $COOCH_3$, $COOC_2H_5$, $COOC_3H_7$, $COOC_4H_9$, $SOOCH_3$, $SOOC_2H_5$, $SOOC_3H_7$ and $SOOC_4H_9$, and the remaining of $R_4$ to $R_8$ is one selected from the group consisting of H, fluorocarbon, methyl, ethyl, propyl and butyl.

5. The method of claim 4, wherein the shaping the resist comprises: compressing the mold plate to contact the etching object layer, the mold plate having a hydrophobic group.

6. The method of claim 4, wherein the hardening the resist comprises irradiating light on the resist while the mold plate holding the shape of the resist.

7. The method of claim 4, wherein the resist becomes a linear polymer by light irradiation.

8. The method of claim 4, wherein the mold plate comprises at least a groove.

9. The method of claim 4, wherein the forming the etching object layer on a substrate comprises:
depositing one of a metal material, a semiconductor material and an insulative material on the substrate.

10. The method of claim 4, further comprising:
etching the etching object layer by using the resist pattern as a mask; and
removing the resist pattern remaining on the etched object layer.

11. A method of forming a resist, comprising;
providing a liquid pre-polymer having structure of the following formula;
adding a photo-initiator and a photo acid generator to the liquid pre-polymer;
exposing the resulting mixture of the liquid pre-polymer, the photo-initiator and the photo acid generator with UV light to generate a linear polymer; and
wherein each of the $R_1$, $R_2$ and $R_3$ is one selected from the group consisting of H, fluorocarbon, methyl, ethyl, propyl and butyl, at least one of the $R_4$ to $R_8$ is a hydrophilic group selected from the group consisting of OH, $COOCH_3$, $COOC_2H_5$, $COOC_3H_7$, $COOC_4H_9$, $SOOCH_3$, $SOOC_2H_5$, $SOOC_3H_7$ and $SOOC_4H_9$, and the remaining of $R_4$ to $R_8$ is one selected from the group consisting of H, fluorocarbon, methyl, ethyl, propyl and butyl,
wherein liquid pre-polymer is about 80 to 88 WT % of the resist, the photo-initiator is 10 to about 15 WT % of the resist, and the photo acid generator is about 2 to 8 WT % of the resist:

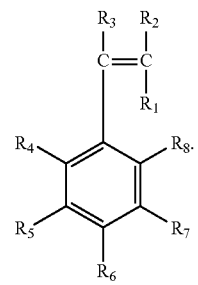

* * * * *